(12) United States Patent
Mao et al.

(10) Patent No.: US 11,839,056 B2
(45) Date of Patent: Dec. 5, 2023

(54) OPTICAL COMMUNICATION ASSEMBLY AND TRANSCEIVER WITH STAMPED METAL FOR HEAT DISSIPATION AND STAMPED HEAT DISSIPATION COMPONENT THEREOF

(71) Applicant: Global Technology Inc., Ningbo (CN)

(72) Inventors: Jiandong Mao, Ningbo (CN); Qilin Hong, Ningbo (CN); Gaofei Yao, Ningbo (CN); Taotao Ye, Ningbo (CN)

(73) Assignee: Global Technology Inc., Ningbo (CN)

( * ) Notice: Subject to any disclaimer, the term of this patent is extended or adjusted under 35 U.S.C. 154(b) by 73 days.

(21) Appl. No.: 17/231,347

(22) Filed: Apr. 15, 2021

(65) Prior Publication Data

US 2022/0248561 A1  Aug. 4, 2022

(30) Foreign Application Priority Data

Feb. 4, 2021  (CN) .......................... 202110153294.1

(51) Int. Cl.
*H05K 7/20* (2006.01)
*H04B 10/40* (2013.01)

(52) U.S. Cl.
CPC ........... *H05K 7/2039* (2013.01); *H04B 10/40* (2013.01)

(58) Field of Classification Search
CPC ........ H01L 2224/48091; H05K 7/2039; H05K 1/0203; H05K 7/20963; H05K 1/021; H05K 3/0061; H04B 10/40; H04B 1/036; H04B 1/3827

See application file for complete search history.

(56) References Cited

U.S. PATENT DOCUMENTS

| | | | | |
|---|---|---|---|---|
| 6,875,056 B1* | 4/2005 | Bianchini | ............. | H01R 12/585 439/82 |
| 2002/0131122 A1* | 9/2002 | Anderl | ................. | H04B 10/806 398/164 |
| 2006/0093287 A1* | 5/2006 | Yoshikawa | .......... | G02B 6/4261 385/92 |
| 2007/0133930 A1* | 6/2007 | Ishikawa | .............. | G02B 6/4283 385/92 |
| 2008/0232067 A1* | 9/2008 | Joiner | ................ | H05K 7/20418 361/707 |
| 2009/0296351 A1* | 12/2009 | Oki | ...................... | G02B 6/4246 361/709 |

* cited by examiner

*Primary Examiner* — Adam B Dravininkas

(74) *Attorney, Agent, or Firm* — Grossman Tucker Perreault Pfleger, PLLC

(57) ABSTRACT

An optical transceiver includes a housing, an optical communication module and a heat dissipation component. The optical communication module is disposed in the housing. The heat dissipation component is disposed in the housing and in thermal contact with the housing and the optical communication module, and the heat dissipation component is a stamped metal plate.

7 Claims, 5 Drawing Sheets

OPTICAL COMMUNICATION ASSEMBLY AND TRANSCEIVER WITH STAMPED METAL FOR HEAT DISSIPATION AND STAMPED HEAT DISSIPATION COMPONENT THEREOF

CROSS-REFERENCE TO RELATED APPLICATIONS

This non-provisional application claims priority under 35 U.S.C. § 119(a) to Patent Application No. 202110153294.1 filed in China on Feb. 4, 2021, the entire contents of which are hereby incorporated by reference.

BACKGROUND

1. Technical Field

The disclosure relates to an optical communication device, more particularly to a pluggable optical transceiver.

2. Related Art

Optical transceivers are generally installed in electronic communication facilities in modern high-speed communication networks. In order to make flexible the design of an electronic communication facility and less burdensome the maintenance of the same, an optical transceiver is inserted into a corresponding cage that is disposed in the communication facility in a pluggable manner. In order to define the electrical-to-mechanical interface of the optical transceiver and the corresponding cage, different form factors such as XFP (10 Gigabit Small Form Factor Pluggable) used in 10 GB/s communication rate, QSFP (Quad Small Form-factor Pluggable), or others at different communication rates have been made available.

At present, heat dissipation of an optical communication module in the optical transceiver is mainly implemented by an optical transceiver housing which further transfers heat to the fins on the cage. Therefore, a proper heat dissipation path is needed inside the optical transceiver in order to quickly transfer the heat generated by optical or electronic components to the housing.

BRIEF DESCRIPTION OF THE DRAWINGS

The present disclosure will become more fully understood from the detailed description given below and the accompanying drawings which are given by way of illustration only and thus are not intending to limit the present disclosure and wherein.

DETAILED DESCRIPTION

Figure 1:
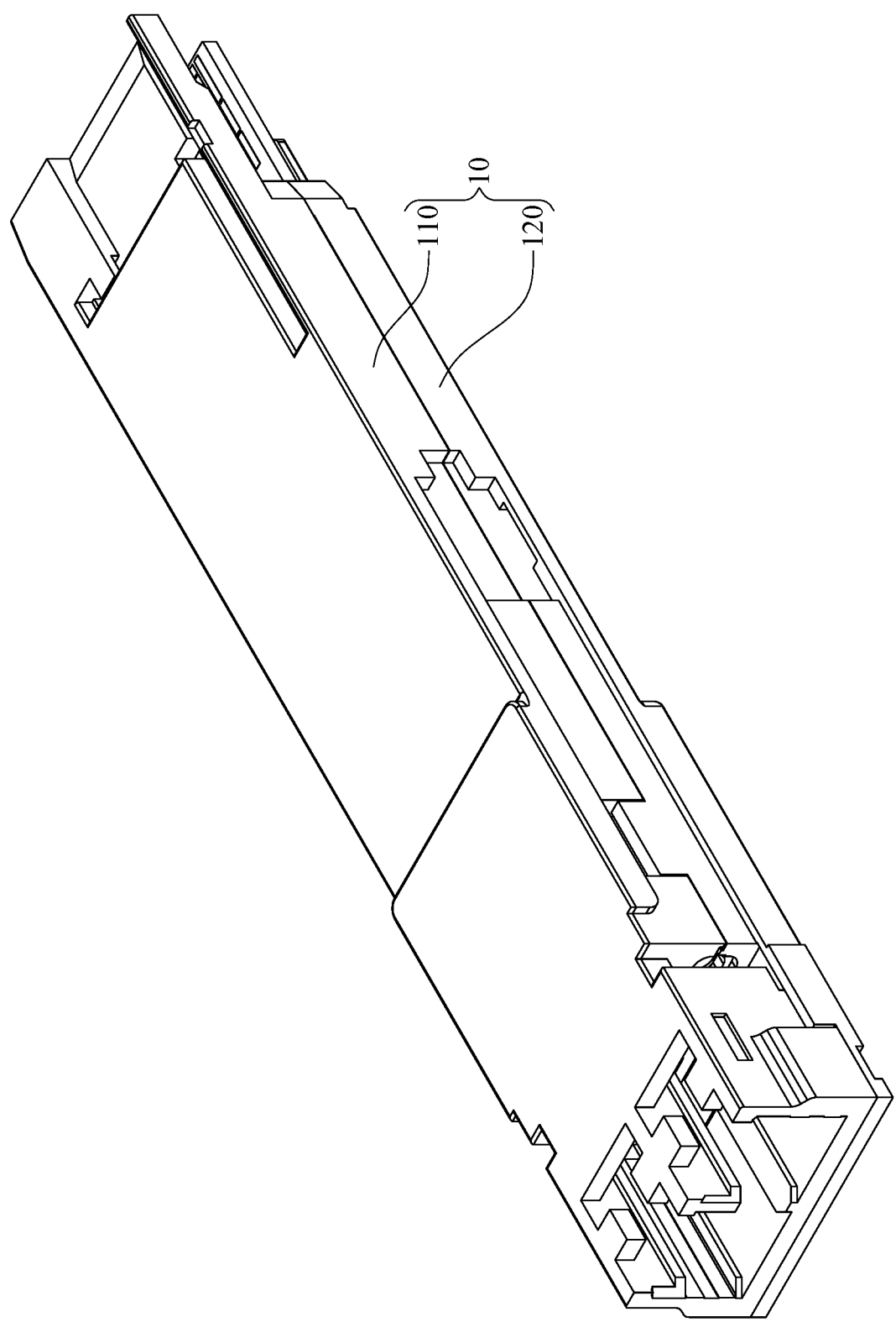
FIG. 1 is a perspective view of an optical transceiver according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
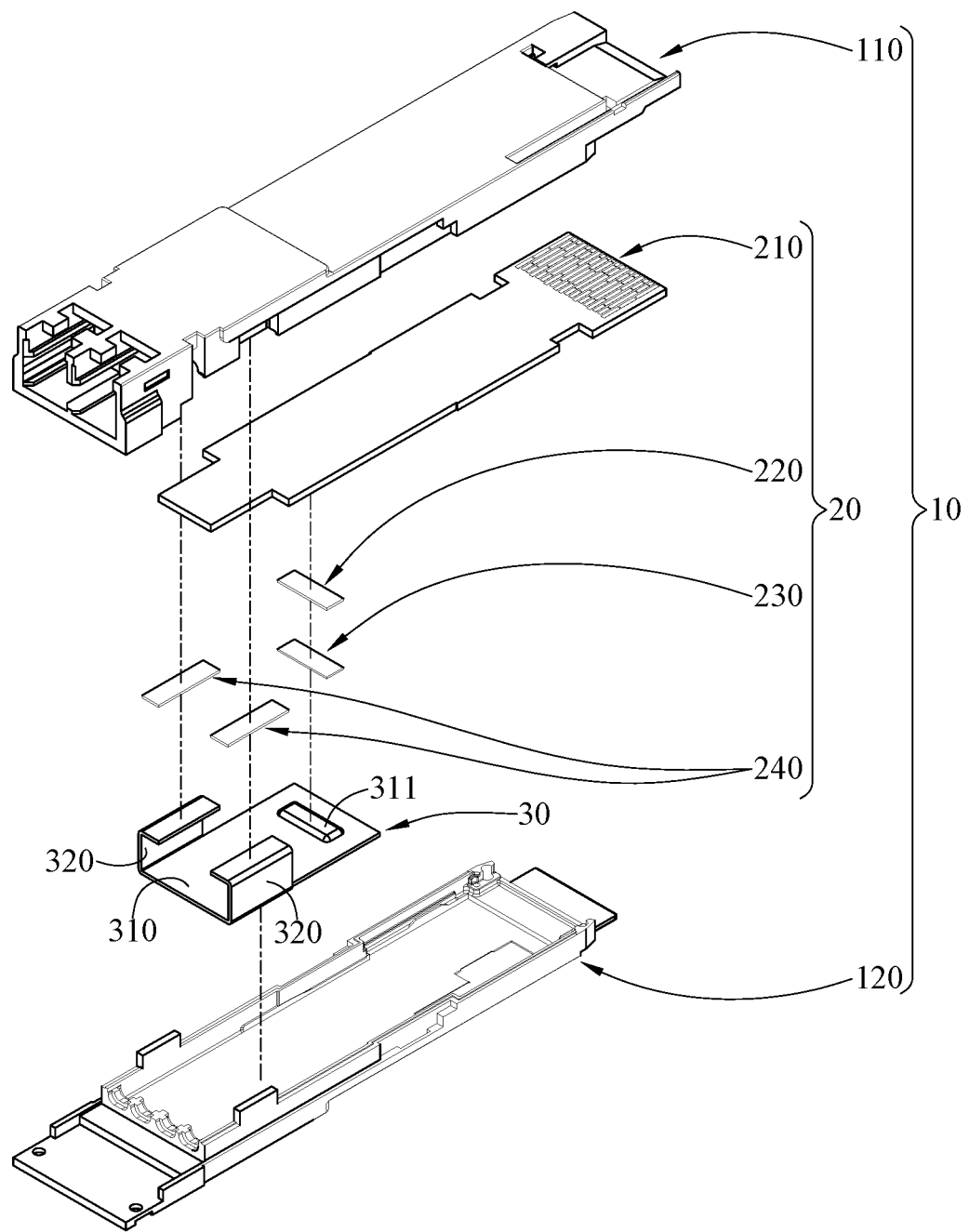
FIG. 2 is an exploded view of the optical transceiver in FIG. 1.

Please refer to FIG. 1 and FIG. 2. FIG. 1 is a perspective view of an optical transceiver according to one embodiment of the present disclosure, and FIG. 2 is an exploded view of the optical transceiver in FIG. 1. In this embodiment, an optical transceiver 1 includes a housing 10, an optical communication module 20 and a heat dissipation component 30.

The housing 10 includes an upper casing 110 and a lower casing 120 which are assembled together. The housing 10 is provided to be disposed in a cage (not shown in FIG. 1) in pluggable manner.

The optical communication module 20 is, for example but not limited to, a transmitter optical sub-assembly (TOSA) or a receiver optical sub-assembly (ROSA) disposed in the housing 10. The optical communication module 20 includes a substrate 210, an optoelectronic device 220 and heat transfer mediums 230 and 240. The optoelectronic device 220 is disposed on the substrate 210, the heat transfer medium 230 is disposed on the bottom surface of the substrate 210, and the heat transfer medium 240 is in thermal contact with the upper casing 110 of the housing 10. The optoelectronic device 220 includes, for example but not limited to, optical component or electronic component. The optical component may be a photodiode or a fiber array, and the electronic component may be a digital IC. In this embodiment, the optoelectronic device 220 is a digital signal processor (DSP) disposed on the bottom surface of the substrate 210 and in thermal contact with the heat transfer medium 230. The substrate 210 is, for example but not limited to, a printed circuit board. Each of the heat transfer mediums 230 and 240 is, for example but not limited to, a graphite gasket or a piece of thermal grease.

Figure 3:
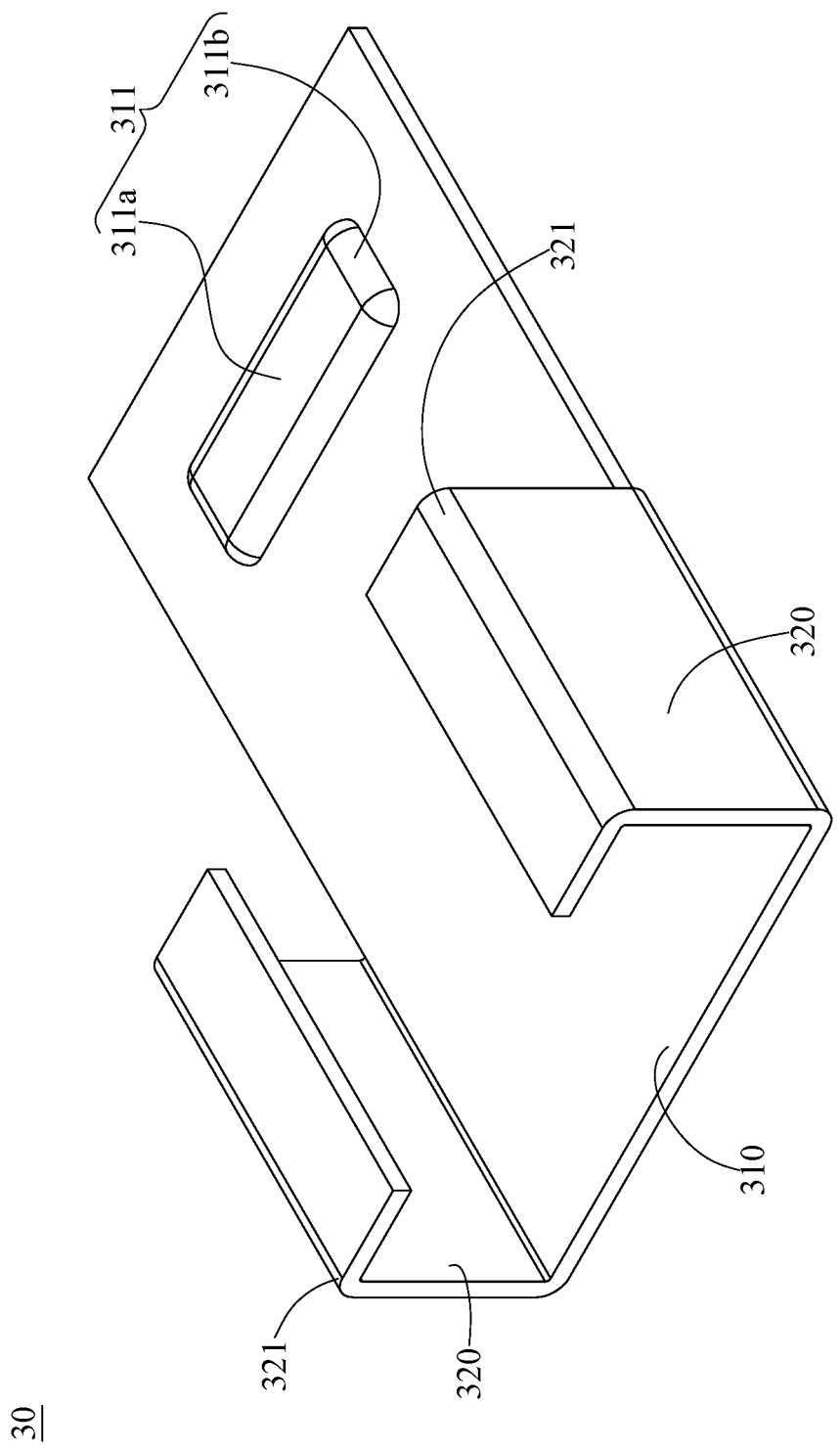
FIG. 3 is a perspective view of a heat dissipation metal component in FIG. 2.
Figure 4:
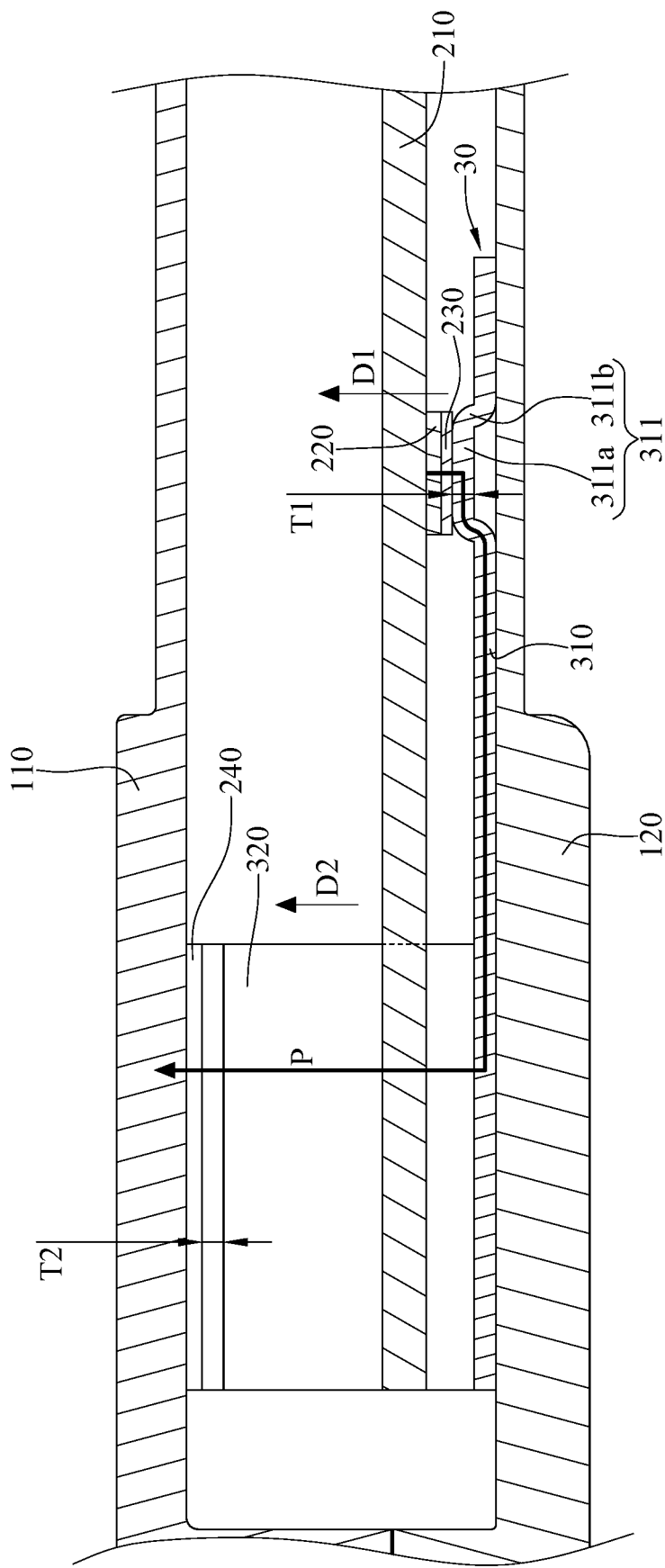
FIG. 4 is an interior side view of the optical transceiver in FIG. 1.

The heat dissipation component 30 is disposed on the housing 10. Please refer to FIG. 3 and FIG. 4. FIG. 3 is a perspective view of a heat dissipation metal component in FIG. 2. FIG. 4 is an interior side view of the optical transceiver in FIG. 1. The bottom of the heat dissipation component 30 can horizontally align with the lower casing 120 of the housing 10. The heat dissipation component 30 includes a main body 310 and at least one side sheet 320. The main body 310 includes a bump 311, and the side sheet 320 is connected to the edge of the main body 310. The optical communication module 20 and the housing 10 are in thermal contact with the bump 311, and the bump 311 is raised toward the optical communication module 20 and the upper casing 110 of the housing 10 along a reference direction D1. More specifically, the heat transfer medium 230 of the optical communication module 20 is disposed between the bottom surface of the substrate 210 and the bump 311 of the heat dissipation component 30. The heat transfer medium 230 is in thermal contact with the substrate 210 and the bump 311. The heat transfer medium 240 is disposed on the side sheet 320 and in thermal contact with the side sheet 320.

In this embodiment, the heat dissipation component 30 is a single piece, and the heat dissipation component 30 is a stamped metal plate. In detail, a single flat metal plate can be placed into a tool or die blanks before being bent or embossed; then, part of the flat metal plate is embossed to from the bump 311, and another part thereof is bent to form the side sheet 320. The rest part of the metal plate, which is not into stamping press, is considered as the main body 310 of the heat dissipation component 30.

The manufacturing of the heat dissipation component 30 by the stamping process can render possible the mass production and reduce manufacturing cost. Moreover, the stamped heat dissipation component 30 benefits from being light in weight and reduced in size, such that it is favorable for preventing excessive occupation of the space inside the transceiver, and preventing the deformation of the transceiver due to the heat dissipation component 30 pressing the housing 10. Accordingly, the service life of the optical transceiver could be properly extended. In this embodiment, the optical transceiver includes bump 311 which contributes structural strength enhancement of the heat dissipation component 30 and prevents low heat dissipation efficiency due to air gaps between the heat dissipation component 30 and the optical communication module 20. It is worth noting that the optical transceiver in the present disclosure is not limited by the above. In some embodiments, if the heat dissipation component is close enough to the optical communication module, it is unnecessary to form a bump on the heat dissipation component. In other words, the heat dissipation component could be implemented in terms of its original shape.

In this embodiment, the bump 311 of the heat dissipation component 30 includes a flat portion 311a and a round portion 311b, and the round portion 311b is located on at least one side of the flat portion 311a. As shown in FIG. 3, in this embodiment, the round portion 311b surrounds the flat portion 311a, and the heat transfer medium 230 of the optical communication module 20 is in thermal contact with the flat portion 311a. The round portion 311b is curved with respect to the flat portion 311a, and the corner of the bump 311 is round (a corner radius can be defined). Moreover, the side sheet 320 includes an arc bending portion 321 at a position where the side sheet 320 is connected to the main body 310. The bump 311 is raised along a reference direction D1, the side sheet 320 extends along a reference direction D2, and the reference directions D1 and D2 are substantially the same. In short, both the reference directions D1, D2 are towards the upper casing 110 of the housing 10. Furthermore, as shown in FIG. 4, the thickness of the side sheet 320 is substantially equal to the thickness of the main body 310 in this embodiment, and the thickness T1 of the bump 311 is smaller than the thickness T2 of the side sheet 320. It is worth noting that the heat dissipation component in the present disclosure is not limited by the above. In some embodiments, the bump may have the same thickness as the side sheet.

The heat dissipation component 30 can transfer heat generated by a heat source (for example, the optoelectronic device 220 of the optical communication module 20) to the housing 10. As shown in FIG. 4, a path P represents that heat generated by the optoelectronic device 220 is transferred to the housing 10 via the heat transfer medium 230, the heat dissipation component 30 and the heat transfer medium 240. Therefore, with the heat dissipation component 30, the heat could be evenly distributed throughout the housing 10 without being accumulated in the lower casing 120 of the housing 10. In order to improve the heat dissipation efficiency, additional heat transfer mediums 230 and 240 can be provided to be in thermal contact with the heat dissipation component 30.

Figure 5:
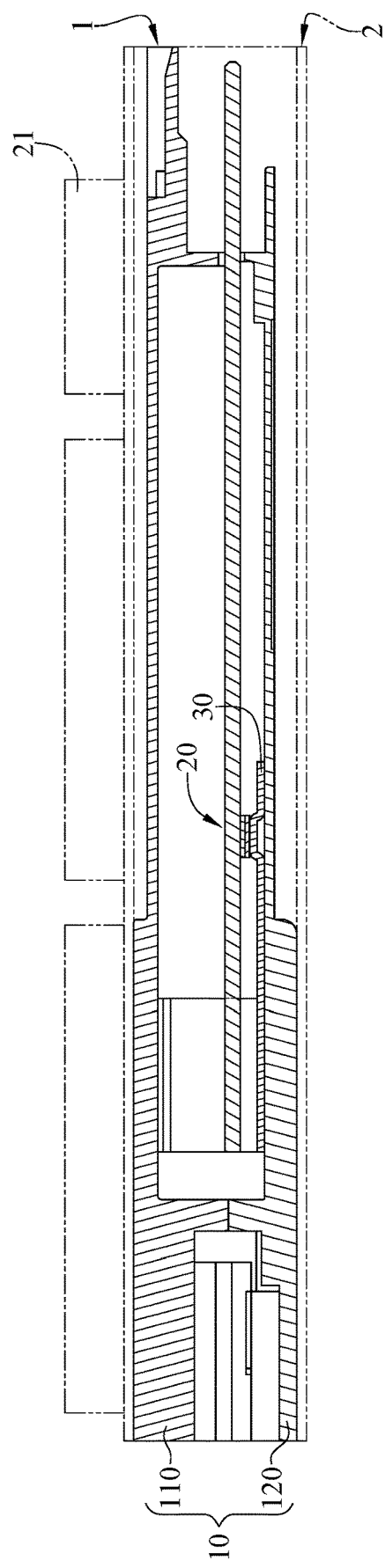
FIG. 5 is a schematic view of an optical communication assembly according to another embodiment of the present disclosure.

FIG. 5 is a schematic view of an optical communication assembly according to another embodiment of the present disclosure. In this embodiment, the optical communication assembly includes an optical transceiver 1 and a cage 2, and the optical transceiver 1 is inserted into corresponding slot/port of the cage 2. Elements in the optical transceiver 1 can be referred in the embodiment depicted by FIG. 1 through FIG. 4, and any description about these elements will not be repeated hereafter. The cage 2 includes a heat dissipation structure 21 extending from a top surface of the cage 2, and the dissipation structure 21 includes a plurality of fins. The heat dissipation structure 21 is provided to be in thermal contact with the housing 10 of the optical transceiver 1. The heat dissipation structure 21 of the cage 2 and the heat dissipation component 30 are located on opposite sides of the optical communication module 20, respectively. In other words, the heat dissipation structure 21 is above the optical communication module 20, and the heat dissipation component 30 is beneath the optical communication module 20. The heat dissipation component 30 helps transfer heat generated by optical communication module 20 to the heat dissipation structure 21 of the cage 2.

According to the present disclosure, heat generated by the optical communication module is evenly distributed to all parts of the housing to prevent heat accumulation in the lower portion of the housing. The heat dissipation component can be made by bending a metal plate through stamping process. Compared with a conventional metal heat dissipation component manufactured by cutting a metal block, the heat dissipation component disclosed in this disclosure can be mass-produced with lower manufacturing cost. Moreover, the stamped metal heat dissipation component enjoys the light weight and small size. The stamped metal heat dissipation component also prevent unfavorable deformation of the optical transceiver caused by the extrusion of the heat dissipation component into the housing, thereby prolonging the service life of the optical transceiver.

The embodiments are chosen and described in order to best explain the principles of the present disclosure and its practical applications, to thereby enable others skilled in the art to best utilize the present disclosure and various embodiments with various modifications as are suited to the particular use that is being contemplated. It is intended that the scope of the present disclosure is defined by the following claims and their equivalents.

What is claimed is:

1. An optical transceiver, comprising:
   a housing;
   an optical communication module disposed in the housing; and
   a heat dissipation component disposed in the housing and in thermal contact with the housing and the optical communication module, wherein the heat dissipation component is a stamped metal plate, wherein the heat dissipation component comprises a bump in thermal contact with the optical communication module, and the bump is raised toward the optical communication module wherein the heat dissipation component comprises a main body and at least one side sheet, the main body comprises the bump, and the at least one side sheet is connected to an edge of the main body; and
   at least one heat transfer medium disposed on the at least one side sheet, and the at least one heat transfer medium is in thermal contact with the housing and the at least one side sheet.

2. The optical transceiver according to claim 1, wherein the heat dissipation component is a single piece.

3. The optical transceiver according to claim 1, wherein the bump comprises a flat portion and a round portion, and the round portion is located on at least one side of the flat portion.

4. The optical transceiver according to claim 3, wherein the round portion surrounds the flat portion.

5. The optical transceiver according to claim 1, wherein the optical communication module comprises an optoelectronic device, a substrate and a heat transfer medium, the optoelectronic device is disposed on the substrate, the heat transfer medium is disposed between the heat dissipation component and a bottom surface of the substrate, and heat transfer medium is in thermal contact with the substrate and the heat dissipation component.

6. The optical transceiver according to claim 1, wherein the at least one side sheet comprises an arc bending portion.

7. The optical transceiver according to claim 1, wherein a thickness of the at least one side sheet is substantially equal to a thickness of the main body.

* * * * *